United States Patent
Wakuda et al.

(10) Patent No.: US 6,538,545 B2
(45) Date of Patent: Mar. 25, 2003

(54) MAGNET, A METHOD OF ADJUSTMENT OF MAGNETIC FIELD AND A MAGNETIC RESONANCE IMAGING APPARATUS

(75) Inventors: Tsuyoshi Wakuda, Hitachi (JP); Shigeru Kakugawa, Hitachi (JP); Yoshihide Wadayama, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/100,278

(22) Filed: Mar. 15, 2002

(65) Prior Publication Data

US 2003/0011455 A1 Jan. 16, 2003

(30) Foreign Application Priority Data

Jul. 16, 2001 (JP) .......................... 2001-215482

(51) Int. Cl.⁷ ................................. G01V 3/00
(52) U.S. Cl. .................. 335/296; 335/297; 335/301; 324/320
(58) Field of Search .................. 335/216, 296–306; 324/318–320

(56) References Cited

U.S. PATENT DOCUMENTS 5,539,366 A    7/1996   Dorri et al. .................. 335/297

FOREIGN PATENT DOCUMENTS

| JP | 60-088409 | 5/1985 |
|----|-----------|--------|
| JP | 61-071606 | 4/1986 |
| JP | 62-013007 | 1/1987 |
| JP | 08-172010 | 7/1996 |
| JP | 2000-070238 | 3/2000 |

OTHER PUBLICATIONS

Romeo, et al. "Magnet Field Profiling; Analysis and Correcting Coil Design",—Magnetic Resonance in Medicine 1, 44–65 (1984).

*Primary Examiner*—Ramon M. Barrera
(74) *Attorney, Agent, or Firm*—Hogan & Hartson, LLP

(57) ABSTRACT

A magnet for use in a magnetic resonance imaging apparatus. The magnet includes magnetic poles and coils. The shape and positioning of the magnetic poles and coils enables provision of a uniform static magnetic field. The magnetic pole is provided with ring-shaped grooves and/or projections which compensate for axi-symmetric components of an inhomogeneous magnetic field and with partial grooves or partial projections not shaped in a ring which compensate for non-axi-symmetric components of the inhomogeneous magnetic field. Since the arrangement of the projections and grooves for compensating for the axi-symmetric and non-axi-symmetric components can also be optimized in design, a space occupied by the magnetic poles can be decreased.

18 Claims, 4 Drawing Sheets

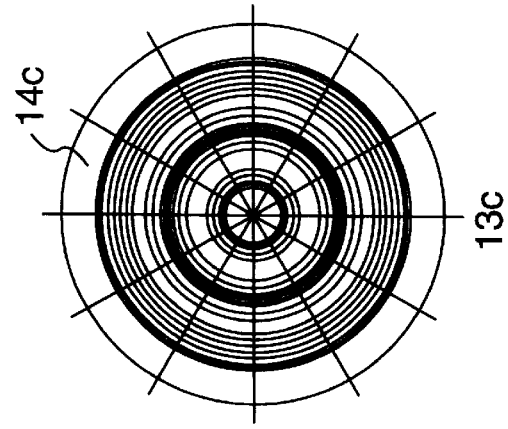
FIG. 4C
FIG. 4B
FIG. 4A
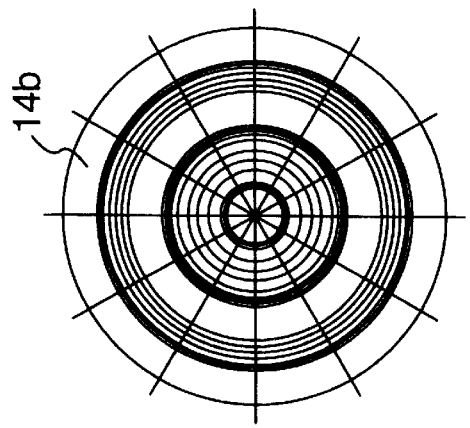
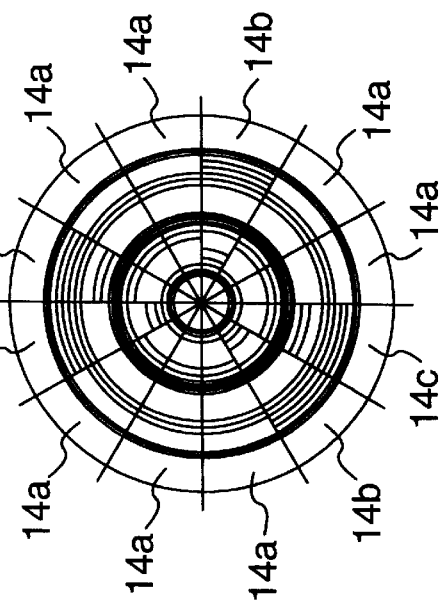
FIG. 4D
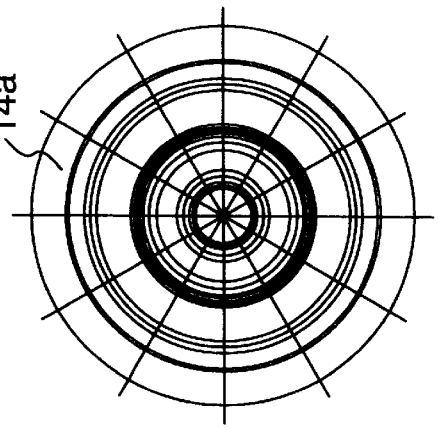

MAGNET, A METHOD OF ADJUSTMENT OF MAGNETIC FIELD AND A MAGNETIC RESONANCE IMAGING APPARATUS

BACKGROUND OF THE INVENTION

The present invention relates to magnets which are suitable for use in magnetic resonance imaging apparatus and more particular, to an open magnet which has a wide opening and generates a uniform magnetic field.

Since a magnetic resonance imaging apparatus (which will be referred to as the MRI apparatus, hereinafter) utilizes a nuclear magnetic resonance phenomenon caused when an electromagnetic wave is irradiated on an object to be inspected placed in a uniform static magnetic field space to obtain an image indicative of its chemical property, the MRI apparatus is used especially in medical fields.

Because the MRI apparatus includes, as its main components, a means for applying a uniform static magnetic field in an imaging volume, an RF coil system for irradiating and receiving an electromagnetic wave, and a means for applying a gradient magnetic field to give position information about a resonance phenomenon.

An MRI apparatus is roughly divided into two types, that is, a horizontal magnetic field type wherein an imaging volume is provided in an interior space of a group of coils made in the form of a coaxial multilayer, and a vertical magnetic field type (open type) wherein a group of coils is provided so as to receive an imaging volume therein and to be opposed thereto. The latter is predominantly used nowadays because it can lighten mental burden to a person to be inspected due to its open structure and can remarkably improve inspector's access ability to a patient to be inspected.

FIG. 2 shows, in cross sectional view, an example of an arrangement of an open MRI apparatus. The apparatus includes, as its main components, magnetic poles 1a and 1b for applying a uniform magnetic field to an imaging volume 10, superconducting coils 5a and 5b, cryostats 6a and 6b, gradient magnetic field coils 7a and 7b for providing position information of a resonance phenomenon, RF coil systems 8a and 8b for irradiating and receiving electromagnetic wave, and uniformity adjusters 9a and 9b for adjusting the uniformity of a magnetic field in an imaging volume, these components being disposed to surround the imaging volume (measuring space) 10 and to be opposed thereto.

The MRI apparatus is being made higher in magnetic field, since an increase in the intensity of static magnetic field enables increase of the intensity of a resonance signal, reduction of an imaging time and a higher level of imaging function. In an open magnet, shift is being made from a conventional type using a permanent magnet to a type using superconducting coils and ferromagnetic material (magnetic poles).

In the MRI apparatus, an magnetic field is required to have a uniformity of 10 ppm or less in a predetermined imaging volume. As prior art methods for generating a uniform magnetic field in a magnet for use in an open MRI apparatus having magnetic poles, there exist techniques wherein ring-shaped magnetic materials or magnets or contour-formed magnetic materials are positioned in magnetic pole portions arranged in an opposed manner across an imaging volume to control a flow of magnetic flux between opposing magnetic poles.

In these techniques of generating a uniform static magnetic field, since magnetic poles are formed or arranged to be symmetric with respect to an axis as its major means for generating a uniform magnetic field, a uniform magnetic field is generated by canceling each other or compensating for magnetic fields of inhomogeneous field components distributed axi-symmetrically. In such a system that the presence of an inhomogeneous magnetic field distributed non-axi-symmetrically cannot be ignored, it is difficult to compensate for it. Accordingly in these methods, a separate means or device for compensating for the non-axi-symmetric inhomogeneous magnetic field is required. As a conventional method for correcting such a non-axi-symmetric inhomogeneous magnetic field, there exists a technique wherein a region having a discrete iron piece positioned between an imaging volume and surfaces of magnetic poles is secured, and an iron for correcting non-axi-symmetric inhomogeneous magnetic field is provided in the region. In this method, however, the region for provision of the magnetic-field correcting iron is required, but is limited in its iron positioning from restrictions demanded by the openness of the magnet and system. In a magnet having non-axi-symmetric passive or active magnetic shield and flux returning means, the magnet has a large non-axi-symmetric inhomogeneous magnetic field. Thus this method has a limit in correcting the non-axi-symmetric inhomogeneous magnetic field and it is impossible to obtain a predetermined field uniformity demanded by the MRI apparatus.

SUMMARY OF THE INVENTION

In accordance with the present invention, there is provided a magnet including a plurality of magnetic-field generating means arranged as nearly opposed to each other and an imaging volume defined by the opposing magnetic-field generating means, wherein the magnetic-field generating means include magnetic poles and coils, a surface of the magnetic pole includes grooves or projections arranged nearly concentrically and formed continuous in a circumferential direction of the magnetic pole surfaces and also includes grooves or projections arranged nearly concentrically and discontinuous in the circumferential direction of the magnetic pole surface.

In the MRI apparatus, a highly uniform static magnetic field in the imaging volume is required. A magnetic field distribution in the imaging volume is determined by a superposition of magnetic fields generated by arrangement of a current, a permanent magnet and all magnetic sources including a magnetic dipole moment in the space. In order to obtain a uniform magnetic field as a magnet for use in the MRI apparatus, it is necessary to arrange the magnetic sources in such a manner as to eventually cancel an inhomogeneous magnetic field generated by the respective magnetic sources. The magnetic sources arranged axi-symmetrically will generate an axi-symmetric magnetic field, and the magnetic sources arranged non-axi-symmetrically will generate a mainly non-axi-symmetric magnetic field. Accordingly compensation of an axi-symmetric magnetic field inhomogenity is carried out by combining with the axi-symmetric arrangement of the magnetic sources mainly; whereas, compensation of a non-axi-symmetric magnetic field inhomogenity is carried out by combining the magnetic sources arranged non-axi-symmetrically.

In the present invention, generation of a uniform magnetic field is realized by arranging a magnetic dipole moment as one of the magnetic sources in a three-dimensional manner, that is, by providing a three-dimensional shape to the magnetic pole surface. Since the coil as the major magnetic source has a ring shape, magnetic dipole moment for compensating for an inhomogeneous magnetic field generated by the coil is arranged in an almost ring-shaped form, whereas non-axi-symmetric arrangement of magnetic dipole moment is necessary to compensate for non-axi-symmetric inhomogeneous magnetic fields caused by an asymmetric magnet structure, that is, an asymmetrically arranged return yoke and passive or active shield. Accordingly the magnetic pole has grooves or projections arranged nearly concentrically and continuous in the circumferential direction and discontinuous grooves or projections in the circumferential direction.

That is, in a magnet including magnetic poles and coils arranged in an opposed manner across an imaging volume for generating a static magnetic field for an MRI apparatus in accordance with the present invention, the magnetic pole facing the imaging volume is arranged to have a non-axi-symmetric shape. As the shape of the above non-axi-symmetric magnetic pole surface, the magnetic pole surface has a projected and recessed surface corresponding to a superposition of ring-shaped recesses and projections arranged axi-symmetrically for compensating for the axi-symmetric inhomogeneous magnetic field and discontinuous, discrete recesses and projections for compensating for the non-axi-symmetric inhomogeneous magnetic field.

The magnetic pole shape is determined as follows. A magnetic field distribution in the imaging volume can be expanded by a mathematical technique in an orthogonal function system and thus the magnetic field distribution is expressed in the form of a superposition of featured magnetic field components corresponding to the orthogonal function system. In order to a uniform magnetic field, in the imaging volume, the expanded magnetic field components other than the constant term of the expansion are set to zero or made small to such an extent that satisfies a demanded predetermined magnetic field uniformity. Arrangement of magnetic dipole moment for effectively compensating for the respective expanded components of the magnetic field can be mathematically determined, and accordingly a magnetic field uniformity in the imaging volume can be attained by determining the magnetic pole shape so as to satisfy the above arrangement.

The magnet of the present invention may have a magnetic circuit for return of magnetic flux having a yoke arranged in a space other than the imaging volume. The magnet of the present invention may have an active or passive shield for reducing a fringe magnetic field. With regard even to these magnets, in order to obtain a high field uniformity, the aforementioned arrangement of the magnetic pole surface can be applied, as in the magnet not having such a magnetic circuit for flux return or magnetic shield as mentioned above.

The magnet of the present invention may be used in a magnetic resonance imaging apparatus. In particular, the magnetic resonance imaging apparatus requires a high accurate field uniformity and thus the application of the present invention thereto is high in significance. As mentioned above, in accordance with the present invention, these can be provided a magnet which can compensate for both of the axi-symmetric and non-axi-symmetric inhomogeneous magnetic fields and in particular, when the magnet is used in an MRI apparatus, an image suitable for medical use can be obtained.

In the magnet of the present invention, a total of the number of grooves or projections continuous or discontinuous in the circumferential direction of the magnetic pole surface and the number of coils included in the opposing magnetic-field generating means may be four or more in one side of the opposing magnetic-field generating means.

In order to obtain a uniform magnetic field, compensating magnetic sources corresponding in number to magnetic field components to be roughly canceled are required. For example, in order to obtain such a uniform magnetic field that an inhomogeneous magnetic field intensity axi-symmetric in an imaging volume of 40 cm in diameter surrounded by a plurality of groups of opposing air core coils vertically symmetrically is within ±10 ppm; it is necessary to arrange four or more coils in one side. Similarly, when a ring-shaped magnetic material is included as a magnetic source, a total number of magnetic sources becomes four or more in one side. In the case of the magnetic pole, grooves and projections made concentrically in and to the magnetic pole correspond to coils and ring-shaped magnetic materials, a surface magnetization current flows on the surface of the magnetic material, and a distribution magnetization current corresponding to a magnetization distribution therein is formed. Formation of ring-shaped grooves or projections in or to the magnetic pole is equivalent to the significant increase of the surface magnetization current, and equivalent to arrangement of a coil having a total current of a sum of the surface magnetization current and distribution magnetization current.

In the magnet of the present invention, grooves or projections periodically in the circumferential direction may be made in or on the magnetic pole surface.

For compensation for non-axi-symmetric components in the magnetic pole, the non-axi-symmetric inhomogeneous magnetic field may be resolved into such magnetic field components periodically waved in the circumferential direction while having a distribution similar to the axi-symmetric inhomogeneous magnetic field. Accordingly in order to compensate for it, with the same idea as in the compensation for the axi-symmetric components, the magnetic sources must be arranged according to periodic change in the circumferential direction. As a method for distributing the compensating magnetic source periodic in the circumferential direction, grooves or projections periodic in the circumferential direction may be formed. Since the surface magnetization current appears mutually reversely in the projection and groove, both of the projections and grooves are compensating magnetic sources having quantitatively different polarities. Axi-asymmetric compensating fields generated by axi-asymmetric magnetic sources (grooves (recesses) or projections) change periodically with the sources position in the circumferential direction (phase).

Accordingly when compensating is made for a certain axi-asymmetric inhomogeneous magnetic field component, two methods by using grooves (recesses) or projections can be selected.

The method for compensating for non-axi-symmetric components in the present invention as mentioned above is completely different from a conventional method for compensating for non-axi-symmetric components by securing a magnetic material arrangement region and adding a magnetic material therein. Upon determining the shape of the magnetic pole, we can select some optimized recess and projection combinations for correcting the axi-symmetric and non-axi-symmetric components which has a smallest weight or undulations, accordingly the magnetic pole becomes compact. With this arrangement, since the non-axi-symmetric inhomogeneous magnetic field is compensated for in the magnetic pole, the need for providing a space for arrangement of a magnetic material or permanent magnet for compensating for the non-axi-symmetric components except for the magnetic pole can be eliminated or remarkably reduced. Further, since the magnet in accordance with the present invention can be mace compact, another magnetic field correcting means can be arranged and with it, its field uniformity can be further increased.

In the magnet of the present invention, the grooves or projections continuous or discontinuous in the circumferential direction of said magnetic pole surface may be formed only by machining the magnetic pole surface. Since grooves and projections for compensation for magnetic field are formed only by machining, there can be provided a magnetic pole which is excellent in their dimensional and positional accuracies.

In the magnet of the present invention, when the grooves or projections discontinuous in said circumferential direction are regarded as continuously arranged nearly on concentric circles, the number of concentric circles may be four or more in one side of the opposing magnetic-field generating means. When a magnetic field distribution in the imaging volume is resolved by a mathematical technique in a suitable function system, four or more major inhomogeneous magnetic field components appear, and the compensation therefore requires the same number of linearly independent magnetic sources as the inhomogeneous magnetic field components.

In the magnet of the present invention, further, the magnetic pole may be reconstructed by dividing a magnetic pole machined concentrically into magnetic pole pieces and combining the divided magnetic pole pieces. In the magnet of the present invention, furthermore, the reconstructed magnetic pole is obtained by combining magnetic pole pieces having different shapes. Since this method involves no three-dimensional machining of the magnetic pole surface and only requires formation of ring-shaped grooves and projections by a lathe, its machining cost and machining time can be reduced to a large extent.

In the method of adjustment of magnetic field according to the present invention in addition, adjustment of a magnetic field may be carried out by using the magnet of the invention, adding a ferromagnetic material piece and/or permanent magnet piece, or removing the ferromagnetic material piece and permanent magnet piece previously mounted. The formation of grooves or projections to the magnet pole surface based on the present invention enables realization of a uniform magnetic field with sufficient reduced axi-symmetric and non-axi-symmetric inhomogeneous magnetic fields. However, even simplification of the magnetic pole surface may sometimes cause failure of attainment of a predetermined field uniformity due to variations in the magnetization characteristics of the magnetic material, a magnet manufacturing error, or an external disturbance by the magnet installation environment. Even in this case, this can be corrected by providing an additional iron piece.

In the method of adjustment of magnetic field according to the present invention, all or part of the ferromagnetic material piece and/or permanent magnet piece may be arranged at a position on a side of the magnetic pole opposed to the imaging volume. This is because the ferromagnetic material piece and/or permanent magnet piece is arranged farther than the other correction regions from the imaging volume and thus a higher order of inhomogeneous magnetic field cannot reach the imaging volume.

A magnetic resonance imaging apparatus or system of the present invention may use the magnet disclosed above. Since the magnet of the invention is used, there can be realized a magnetic resonance imaging apparatus or system which is high in the field uniformity of the imaging volume.

Since the magnet of the present invention includes a means for compensating axi-symmetric and non-axi-symmetric magnetic fields in the form of an integrated magnetic pole, the need for separately providing a means for compensating for the non-axi-symmetric inhomogeneous magnetic field can be eliminated or reduced to a large extent. Accordingly the magnet can be made compact. Further, since the magnet can be made compact, an additional magnetic-field compensating means can be provided with a sufficient margin and the provision thereof enables improvement of a field uniformity.

BRIEF DESCRIPTION OF THE DRAWINGS

FIGS. 4A to 4D show, in a model form, simplified structures of a magnetic pole in the present invention;

DESCRIPTION OF THE EMBODIMENTS

Figure 3:
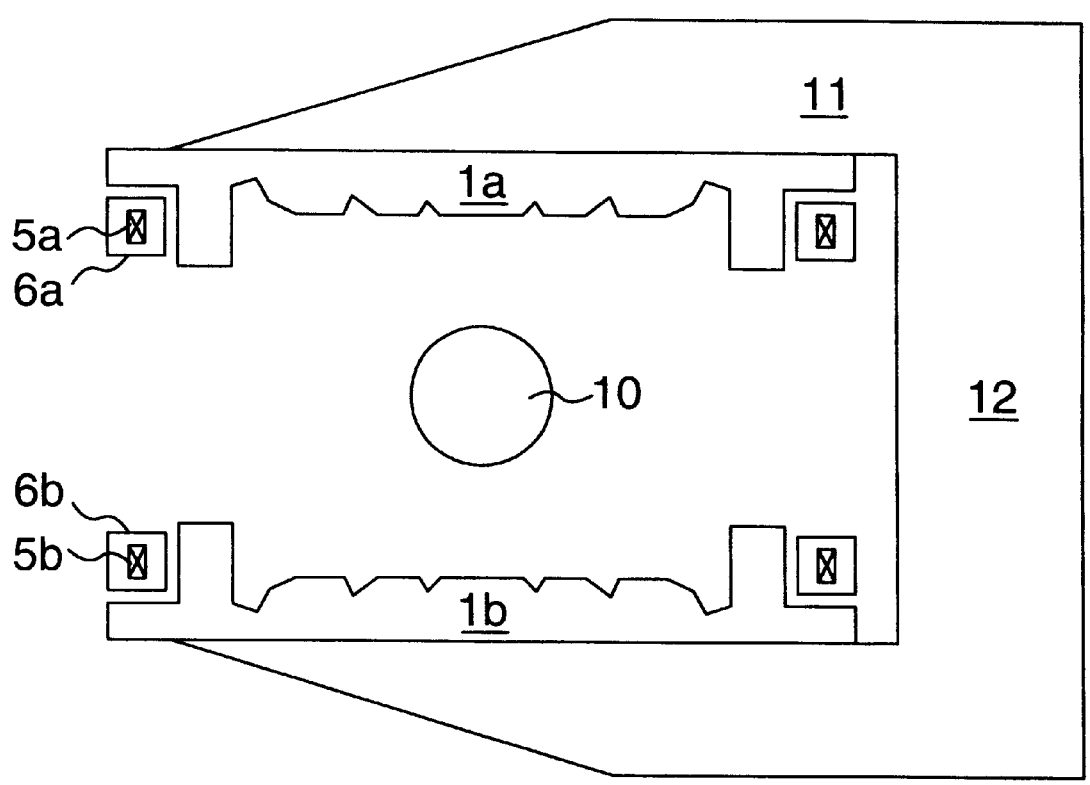
FIG. 3 shows a cross-sectional view of an arrangement of a magnet for use in an MRI apparatus in accordance with the present invention.

FIG. 3 shows a cross-sectional view of a magnet for use in an MRI apparatus to which the present invention is applied. The MRI apparatus includes a static-magnetic-field generating means which has superconducting coils 5a and 5b, cryostats 6a and 6b for storing the superconducting coils therein, and magnetic poles 1a and 1b made of magnetic material and arranged so that magnetic flux lines passed through the superconducting coils are focused or diffused in an imaging volume 10. The static-magnetic-field generating means is arranged in an opposed manner across space 10. Although a pair of the superconducting coils 5a and 5b are illustrated as a major magnetic-field generating source in the drawing, the present invention is not limited to the pair, but the static-magnetic-field generating means may have a plurality of pairs of coils according to the demanded intensity or uniformity of a static magnetic field. Or the static-magnetic-field generating means may have superconducting coils and permanent magnets. The magnetic poles 1a and 1b are provided with a ring-shaped projection or groove or with projections or grooves which are not completely continuous in a circumferential direction. In order to reduce a leakage magnetic field, it is preferable that the opposing magnetic poles 1a and 1b be magnetically coupled with each other by a yoke plate 11 to form a magnetic circuit. Though a single heel column 12 is illustrated in the drawing, the heel column is not limited to the single but may include a plurality of such heel columns to form a magnetic circuit. As a method for reducing a leakage magnetic field, the method is not limited to use of the yoke plate to form a magnetic circuit but may use a shield coil.

Figure 1:
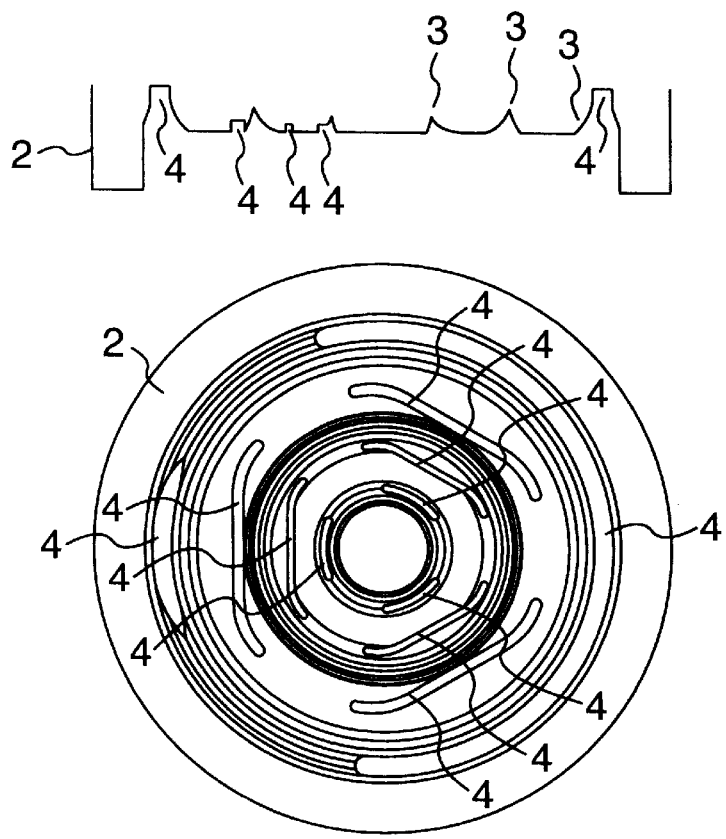
FIG. 1 shows cross-sectional and front views of a shape of a magnetic pole.
Figure 2:
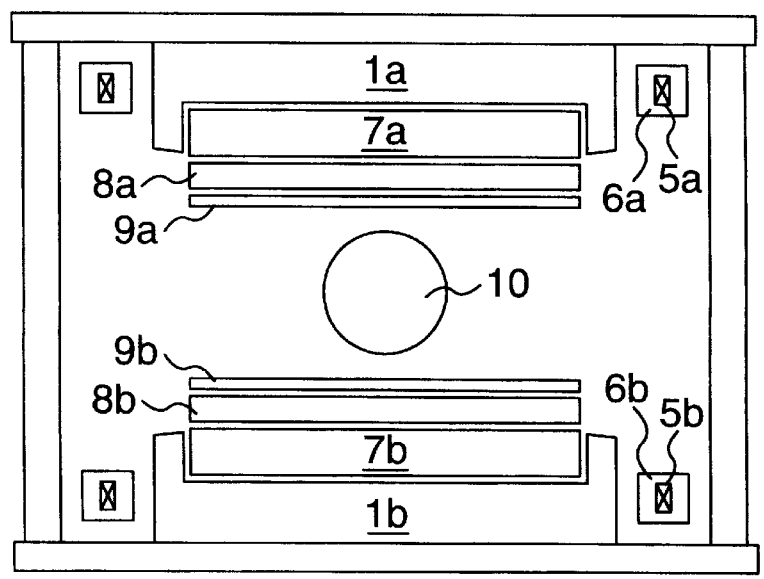
FIG. 2 is a cross-sectional view for explaining the concept of an open MRI apparatus.

FIG. 1 shows horizontal cross-sectional and front views of an embodiment. Assuming that a three-dimensional curved surface or plane generated by rotating a segment by 360 degrees with resect to a central axis and sweeping the segment is defined as a ring-shaped surface, then the shape of the surface of the magnetic pole is formed by continuation of such ring-shaped surfaces. Assume that an angle made between the central axis and a normal vector at each point on the ring-shaped surface is defined as the gradient of the ring-shaped surface. When a set of ring-shaped surfaces defining the general shape of the magnetic pole is viewed from the center of the magnetic pole toward outwards of its radial direction, the gradient of the ring-shaped surface varies and there exist a plurality of locations where the sign of the gradient of the ring-shaped surface changes. A part in adjacent regions at which the sign varies will be represented as a ring-shaped groove (for a recessed part) or a ring-shaped projection (for a raised part). Thus a ring-shaped groove and a ring-shaped projection which have a complete symmetric shape with respect to a central axis will be referred to, in a narrow sense, merely as the ring-shaped groove and ring-shaped projection; whereas, grooves and projections each having a nearly circular ring shape and continuous in a circumferential direction will be referred to, in broad sense, merely as the ring-shaped grooves and ring-shaped projections, respectively. Both are not distinguished from each other, unless otherwise stated. With respect to the ring-shaped grooves and ring-shaped projections, a groove and a projection not continuous in the peripheral direction will be referred to as the partial groove and partial projection respectively. The surface of the magnetic pole shown in FIG. 1 is formed as continuous ring-shaped surfaces, that is, three ring-shaped grooves 3, a single ring-shaped projection 2, and eleven partial grooves 4. The ring-shaped surface functions to provide an axi-symmetric magnetic-field distribution in an imaging volume, and the presence of the ring-shaped grooves and projections causes the non-uniformity of the axi-symmetric magnetic field to be corrected. The partial grooves and projections function mainly to provide an non-axi-symmetric magnetic field distribution in the imaging volume, which causes the non-axi-symmetric magnetic field distribution to be corrected.

The axi-symmetric shape of the magnetic pole in the present embodiment is obtained by machining a disk-shaped iron plate axi-symmetrically by a lathe to form predetermined ring-shaped grooves. The ring-shaped projections usually called Rose shim are separately manufactured and integrated with the grooved plate. When the magnetic pole is formed to have a surface made of ring-shaped surfaces continuous in its radial direction, a static magnetic field in the imaging volume having a diameter of 40 cm was capable of having a axi-symmetric inhomogeneous magnetic-field component of 8 ppm or less. This value was not attained in the conventional methods based on a combination of discrete magnetic-field adjustment rings. In the conventional methods, a field uniformity is about 30 ppm at most. Since the magnetic pole in the present embodiment is formed to have a surface made of continuous ring-shaped surfaces, the gradient of the magnetic pole surface is discontinuous toward the outside of the magnetic pole center. However, when the number of continuous ring-shaped surfaces is made sufficiently large and when the magnetic pole surface is made to have a completely smooth three-dimensional curved surface, axi-symmetric inhomogeneous magnetic field can be further reduced. In the present embodiment, the ring-shaped grooves have been made by machining the disk-shaped iron plate. However, the present method is not limited to the above specific method, but the a plurality of may be formed, for example, by combining a plurality of magnetic rings or magnetic pieces having ring-shaped surfaces. This holds true even for the ring-shaped projection.

In the present embodiment, the major axi-symmetric magnetic-field generating means includes, in one side of the magnet, one coil, three ring-shaped grooves and one ring-shaped projection. However, the present invention is not limited to the specific arrangement but the numbers of coils, ring-shaped grooves and projections may be changed in such a range as to be able to provide a predetermined magnetic field intensity and uniformity. In order to obtain a uniform magnetic field having an inhomogeneous magnetic field of 10 ppm or less in an imaging volume of 40 cm in diameter, it will be seen from simple calculation that, in an open magnet with an air core coil alone for use in an MRI apparatus, four more coils are required in one side. The reason is as follows. When a magnetic field distribution in the imaging volume is resolved by a mathematical technique with use of a suitable function system, four more major inhomogeneous magnetic field components appear. In order to compensate for the components, the same number of linearly-independent magnetic sources as the component number is required. When ring-shaped grooves and projections are formed in and on the magnetic pole, a magnetization current appears on the surfaces of the grooves and projections, which becomes a magnetic field generation source for compensation of the magnetic field. In order to generate a uniform magnetic field as in the magnet structure based on the air core coil, four or more magnetic sources are required and thus the numbers of coils, ring-shaped grooves and ring-shaped projections are required to be four or more in one side of the magnet. In the case of the coil, however, its current value can be set arbitrarily but its magnetization current cannot be set arbitrarily. In the case of the groove and projection, its design flexibility is less than in the case of the coil, because certain volumes of ring-shaped groove and projection are required in order to form an effective magnetic source, their spatial flexibility is restricted because of importance of their shapes, and the magnetization current has its maximum value resulting from a magnetic saturation phenomenon of the magnetic pole. For these reasons, for the purpose of obtaining a uniform magnetic field, it is desirable to increase the numbers of ring-shaped grooves and projections.

Although eleven partial grooves 4 are arranged on circles nearly concentric with respect to a center in FIG. 1, the partial grooves are not necessarily required to be arranged concentrically. When the magnetization distribution in the magnetic pole is nearly symmetric with respect to an axis, an arrangement pattern having a rotational symmetry with respect to the central axis often appears. Further, the partial grooves alone illustrated in the drawing. However, the magnetic field compensation means is not limited to the partial grooves, but partial projections may be provided. In this case, the partial projections can be obtained by separately manufacturing partial projections and mechanically integrating these projections onto a magnetic pole surface metallurgically, by means of bolt or the like. From the viewpoint of securing a good mounting position accuracy, however, it is desirable to form these projections directly on the magnetic pole surface by machining. The section of each partial groove is cut stepwise in the drawing. However, the sectional shape is not limited to the specific shape but may desirably have such a gradient surface as continuous to the magnetic pole with a slow tilt or have a smooth curved surface. When such a smooth gradient surface or curved surface shape is employed, a magnetic field distribution can be obtained much smoother than the magnetic field distribution established by the partial grooves having the stepwise cut section or partial projections. Further, though the shape of the partial grooves is illustrated as having nearly constant width and depth in the drawing, the present invention is not limited to this example. When the groove shape is varied more smoothly toward an arbitrary direction including the radial and circumferential directions, a much smoother magnetic field distribution can be obtained. Further, when the groove shape is waved or varied periodically, a high degree of compensation for the inhomogeneous magnetic field can be obtained. This also holds true even for use of partial projections as the compensation means. In an simulation example of the present embodiment, when partial grooves having a rectangular section are formed, non-axi-symmetric components were able to be reduced from 397 ppm to 50 ppm or less in a y term, from 598 ppm to −50 ppm or less in a $z^2y$ term, from 171 ppm to 50 ppm or less in an $x^2y^2$ term, and from −127 ppm to −20 ppm or less in a $z^2x^2y^2$ term.

In order to compensate for three-dimensional components of an inhomogeneous magnetic field, unlike the conventional magnetic field correction method for adding only compensating iron pieces, the method of the invention can add or reduce such compensating iron pieces in the design of the magnetic pole, and thus a design flexibility of magnetic field correction can be increased to a large extent. In the conventional uniform magnetic-field generating method for compensating for only the axi-symmetric inhomogeneous magnetic field in the magnetic pole and correcting the non-axi-symmetric inhomogeneous magnetic field with use of compensating iron pieces, the iron pieces for correcting the non-axi-symmetric magnetic field generates a new axi-symmetric inhomogeneous magnetic field, which requires further addition of iron pieces in order to cancel the axi-symmetric inhomogeneous magnetic field. However, the present invention can design the shape of the magnetic pole taking both of the axi-symmetric inhomogeneous magnetic field and non-axi-symmetric inhomogeneous magnetic field into consideration, the invention can reduce the number of unnecessary processing steps and the number of iron pieces. Further, since magnetization arrangement and combination of grooves and projections for compensating for an inhomogeneous magnetic field to provide a magnetic pole surface shape as to minimize the quantity of machining can be optimized, there can be realized a magnetic pole shape by a minimum amount of necessary three-dimensional machining. As a result, a machining cost can be reduced, and a magnetic pole with excellent dimensional and positional accuracies can be provided because grooves and projections for compensation of magnetic field are formed by machining. The machining accuracy can be controlled to be 0.1 mm or less.

It is most desirable to machine the magnetic pole surface into a smooth three-dimensional curved surface for the purpose of obtaining a uniform static magnetic field. In the present embodiment, however, for the purpose of simplifying the magnetic pole forming method and reducing its machining cost, the magnetic pole surface is formed symmetric with respect to axis and then subjected to a three-dimensional machining to form a magnetic pole. An alternative of the magnetic pole forming method, such a magnetic pole as shown in FIG. 4D is reconstructed by preparing a plurality of magnetic poles 13a, 13b and 13c having different ring-shaped grooves or projections formed therein as shown in FIGS. 4A to 4C, dividing the magnetic poles in their circumferential direction into magnetic pole pieces 14a, 14b and 14c and combining necessary ones of the magnetic pole pieces. Since this method involves no three-dimensional machining for the magnetic pole surface and only requires formation of ring-shaped grooves and projections by means of a lathe, its machining cost can be reduced to a large extend and a machining time can also be shortened.

With the aforementioned arrangement, an axi-symmetric inhomogeneous magnetic field and an non-axi-symmetric inhomogeneous magnetic field can both be sufficiently reduced to obtain a uniform magnetic field. However, due to variations in magnetization characteristics of the magnetic material, a manufacturing error in the magnet, an external disturbance caused by a magnet installation environment, or cost reduction; the simplification of machining of the magnetic pole surface may sometimes disable achievement of a predetermined field uniformity. This can be corrected by arranging additional iron pieces.

Figure 5:
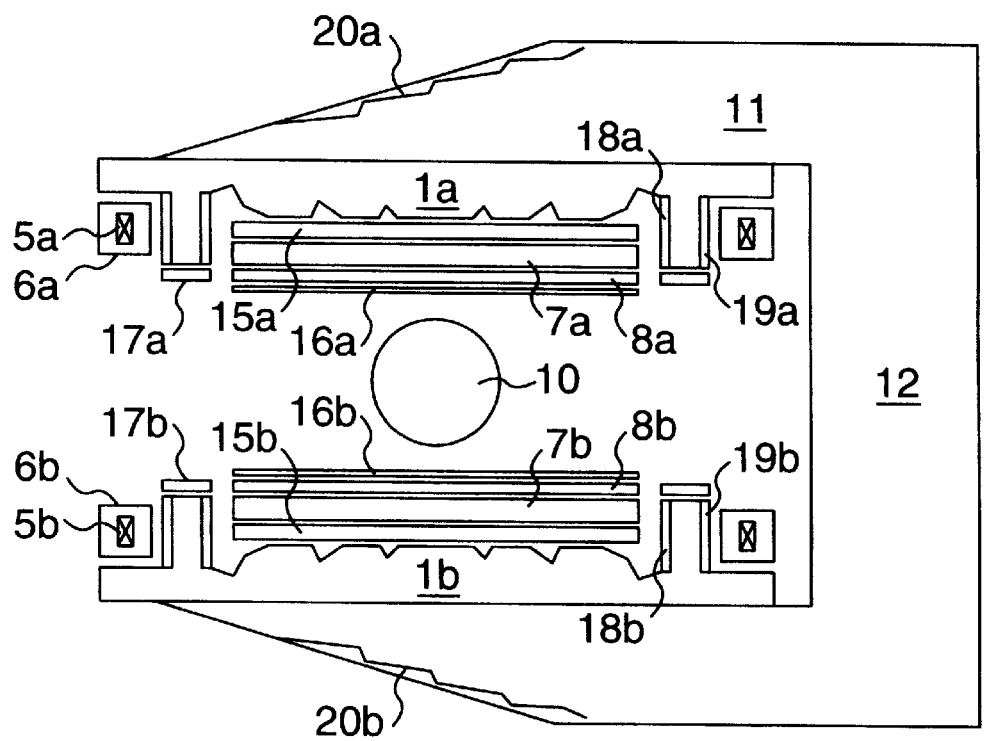
FIG. 5 is a diagram showing regions for disposition of magnetic-field correcting iron pieces.

Shown in FIG. 5 are regions in which additional iron pieces are to be arranged. Regions for arrangement of correcting iron pieces are assumed to include correction regions 1 (15a and 15b), correction regions 2 (16a and 16b), correction regions 3 (17a and 17b), correction regions 4 (18a and 18b), correction regions 5 (19a and 19b), and correction regions 6 (20a and 20b). In this connection, any of these correction regions are out of an imaging volume, and the correction regions 6 20a and 20b are arranged at positions on a side of the magnetic poles 1a and 1b opposed to the imaging volume. Since the magnetic-field correcting abilities of the respective regions to inhomogeneous magnetic field components resolved by a mathematical technique vary from magnetic field component to magnetic field component, it is necessary to select the correction regions suitable for features of the remaining inhomogeneous magnetic field. One of the correction regions closer to the imaging volume 10 and having a larger view angle (three-dimensional angle) viewed from the imaging volume to the correction region has a more excellent correcting ability. For this reason, in the prior art, the correction regions 1, 2, 3 and 4 (especially 1 and 3) have been mainly used as regions between the magnetic pole and imaging volume.

Figure 6:
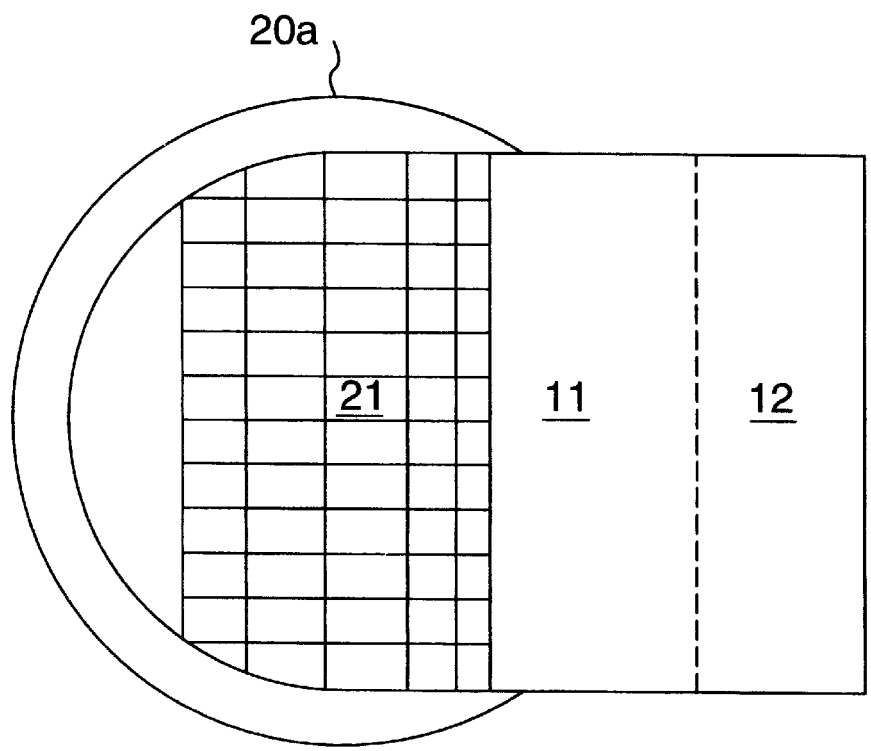
FIG. 6 is a diagram for explaining an array of the magnetic-field correcting iron pieces.

In the present embodiment, in addition to the correction regions 1 and 3 so far used in the prior art, correction regions 6 (20a and 20b) in FIG. 5 is used as regions on a side of the magnetic pole opposed to the imaging volume. With the arrangement of the magnet of the invention, since most of a magnetic field is generated by a passive magnetic material, the uniformity of the magnetic field is influenced by variations in the magnetization characteristics of the magnetic material. Since variations in the magnetization characteristics cause a large change of a flow of magnetic flux lines in the magnetic material, a correcting means for adjusting an entire flow of magnetic flux lines is valid. To this end, as shown in FIG. 6, an inhomogeneous magnetic field is corrected by controlling a flow of magnetic flux in such a manner that a magnetic material block 21 forming the correction regions 6 (20a and 20b) can be removably mounted. As a result, the uniformity of the magnetic flux was able to be remarkably improved without causing a high order of inhomogeneous magnetic field which is hard in its correction. The reason is as follows. The correction regions 6 are spaced from the imaging volume 10 farther than the other correction regions, and do not face the imaging volume 10 directly, whereby high order of inhomogeneous magnetic field caused by the shape or discrete array of the magnetic materials of the correction regions 6 will not reach the imaging volume. When compared with no use of the correction regions 6, a total quantity of iron pieces used in the correction regions 1 and 3 can be reduced to ⅓ and a time taken for magnetic field adjustment can be correspondingly shortened.

In the present embodiment, the magnetic material block 21 has been removably mounted. However, it is unnecessary to always mount the block removably, and an iron piece installation mechanism including a tray structure for installation of a correcting additional iron piece may be provided. Further, the magnetic material block is not limited to the shape in FIG. 6 but may have an arbitrary shape.

It should be further understood by those skilled in the art that the foregoing description has been made on embodiments of the invention and that various changes and modifications may be made in the invention without departing from the spirit of the invention and scope of the appended claims.

What is claimed is:

1. A magnet comprising a plurality of magnetic-field generating means arranged as nearly opposed to each other and an imaging volume defined by said opposing magnetic-field generating means, wherein said magnetic-field generating means include magnetic poles and coils, a surface of said magnetic pole includes grooves or projections arranged nearly concentrically and formed continuous in a circumferential direction of the magnetic pole surfaces and also includes grooves or projections arranged nearly concentrically and discontinuous in the circumferential direction of said magnetic pole surface.

2. A magnet as set forth in claim 1, wherein said magnet has a magnetic circuit for return of the magnetic flux having a yoke provided in a space other than said imaging volume.

3. A magnet as set forth in claim 1, wherein said magnet includes an active or passive shield for reducing a leakage magnetic field.

4. A magnet as set forth in claim 1, wherein said magnet is a magnet for use in a magnetic resonance imaging apparatus.

5. A magnet as set forth in claim 1, wherein a total of the number of grooves or projections continuous or discontinuous in the circumferential direction of said magnetic pole surface and the number of coils included in said opposing magnetic-field generating means is four or more in one side of said opposing magnetic-field generating means.

6. A magnet as set forth in claim 1, wherein said magnetic pole surface has grooves or projections formed periodically in the circumferential direction.

7. A magnet as set forth in claim 1, wherein the grooves or projections continuous or discontinuous in the circumferential direction of said magnetic pole surface are formed only by machining the magnetic pole surface.

8. A magnet as set forth in claim 1, wherein, when the grooves or projections discontinuous in said circumferential direction are regarded as continuously arranged nearly on concentric circles, the number of said concentric circles is four or more in one side of said opposing magnetic-field generating means.

9. A magnet as set forth in claim 1, wherein said magnetic pole is reconstructed by dividing a magnetic pole machined concentrically into magnetic pole pieces and combining divided magnetic pole pieces.

10. A magnet as set forth in claim 9, wherein said reconstructed magnetic pole is obtained by combining magnetic pole pieces having different shapes.

11. A magnetic resonance imaging apparatus or system comprising a magnet as set forth in claim 1.

12. A magnet comprising:

a plurality of magnetic poles and coils arranged as nearly opposed to each other and an imaging volume defined by the opposing magnetic poles and coils; and a surface of said magnetic pole includes grooves or projections arranged nearly concentrically and formed continuous in a circumferential direction of the magnetic pole surfaces and also includes grooves or projections arranged nearly concentrically and discontinuous in the circumferential direction of said magnetic pole surface.

13. A magnet as set forth in claim 12, wherein said magnet has a magnetic circuit for return of the magnetic flux having a yoke provided in a space other than said imaging volume.

14. A magnet as set forth in claim 12, wherein said magnetic pole surface has grooves or projections formed periodically in the circumferential direction.

15. A magnet as set forth in claim 12, wherein said magnetic pole is reconstructed by dividing a magnetic pole machined concentrically into magnetic pole pieces and combining divided magnetic pole pieces.

16. A method of adjusting a magnetic field comprising:

arranging a plurality of magnetic poles and coils as nearly opposed to each other and defining an imaging volume by the opposing magnetic poles and coils; and providing a surface of said magnetic pole with grooves or projections arranged nearly concentrically and formed continuous in a circumferential direction of the magnetic pole surfaces and also providing grooves or projections arranged nearly concentrically and discontinuous in the circumferential direction of said magnetic pole surface.

17. The method according to claim 12 further comprising:

adding a ferromagnetic material piece and/or permanent magnet piece or removing said ferromagnetic material piece and permanent magnet piece previously mounted.

18. The method according to claim 16 further comprising:

arranging at a position on a side of said magnetic pole opposed to said imaging volume, all or part of said ferromagnetic material piece and/or permanent magnet piece.

* * * * *